(12) United States Patent
Dixon et al.

(10) Patent No.: US 9,466,637 B2
(45) Date of Patent: Oct. 11, 2016

(54) LOW NOISE HYBRIDIZED DETECTOR USING CHARGE TRANSFER

(71) Applicant: Sensors Unlimited, Inc., Princeton, NJ (US)

(72) Inventors: Peter Dixon, Lawrenceville, NJ (US); Navneet Masaun, Franklin Park, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 14/792,065

(22) Filed: Jul. 6, 2015

(65) Prior Publication Data

US 2016/0035783 A1 Feb. 4, 2016

Related U.S. Application Data

(60) Provisional application No. 62/032,918, filed on Aug. 4, 2014.

(51) Int. Cl.
*H01L 29/732* (2006.01)
*H01L 27/146* (2006.01)
*H01L 31/109* (2006.01)
(Continued)

(52) U.S. Cl.
CPC ... *H01L 27/14649* (2013.01); *H01L 27/14616* (2013.01); *H01L 27/14679* (2013.01); *H01L 27/14689* (2013.01); *H01L 27/14694* (2013.01); *H01L 29/205* (2013.01); *H01L 29/452* (2013.01); *H01L 29/495* (2013.01); *H01L 31/03046* (2013.01); *H01L 31/109* (2013.01);
(Continued)

(58) Field of Classification Search
CPC ............... H01L 27/14612; H01L 27/14649; H01L 27/14694; H01L 29/205; H01L 29/452; H01L 29/495; H01L 31/0304; H01L 31/03046; H01L 31/109; H01L 31/1844
USPC ............ 257/183.1, 184, 187, 188, 189, 192
See application file for complete search history.

(56) References Cited

U.S. PATENT DOCUMENTS 5,386,128 A 1/1995 Fossum et al.
5,410,168 A 4/1995 Hisa
(Continued)

FOREIGN PATENT DOCUMENTS

EP 0286348 A2 10/1988
JP 2670553 B2 10/1997

OTHER PUBLICATIONS

"A 128X128 InGaAs Detector Array for 1.0-1.7 Microns" G. Olsen, et. al., SPIE vol. 1341 Infrared Technology XVI (1990), pp. 432-437.
(Continued)

*Primary Examiner* — Hung Vu
(74) *Attorney, Agent, or Firm* — Kinney & Lange, P.A.

(57) ABSTRACT

A low noise infrared photodetector has an epitaxial heterostructure that includes a photodiode and a transistor. The photodiode includes a high sensitivity narrow bandgap photodetector layer of first conductivity type, and a collection well of second conductivity type in contact with the photodetector layer. The transistor includes the collection well, a transfer well of second conductivity type that is spaced from the collection well and the photodetector layer, and a region of first conductivity type between the collection and transfer wells. The collection well and the transfer well are of different depths, and are formed by a single diffusion.

11 Claims, 7 Drawing Sheets

(51) Int. Cl.
   *H01L 31/18*      (2006.01)
   *H01L 29/45*      (2006.01)
   *H01L 29/49*      (2006.01)
   *H01L 29/205*     (2006.01)
   *H01L 31/0304*    (2006.01)
   *H01L 31/103*     (2006.01)
   *H01L 31/112*     (2006.01)

(52) U.S. Cl.
   CPC ......... *H01L 31/1035* (2013.01); *H01L 31/112* (2013.01); *H01L 31/1844* (2013.01)

(56) References Cited

U.S. PATENT DOCUMENTS

| | | | |
|---|---|---|---|
| 6,005,266 A | 12/1999 | Forrest et al. | |
| 6,573,581 B1 | 6/2003 | Sugg et al. | |
| 7,521,737 B2 * | 4/2009 | Augusto | H01L 27/14643 257/184 |
| 7,876,422 B2 * | 1/2011 | Hashimoto | G01S 17/36 257/184 |
| 8,860,083 B1 | 10/2014 | Trezza | |
| 2006/0186501 A1 * | 8/2006 | Ishimura | H01L 31/107 257/436 |
| 2007/0018075 A1 | 1/2007 | Cazaux et al. | |
| 2008/0111165 A1 | 5/2008 | Kao | |
| 2010/0230720 A1 | 9/2010 | Wicks | |
| 2010/0271108 A1 | 10/2010 | Sanfilippo et al. | |
| 2016/0035783 A1 | 2/2016 | Dixon et al. | |

OTHER PUBLICATIONS

Belgium Search Report and Written Opinion for BE Application No. BE2015/5342, dated Apr. 22, 2016, 34 Pages.

* cited by examiner

LOW NOISE HYBRIDIZED DETECTOR USING CHARGE TRANSFER

CROSS-REFERENCE TO RELATED APPLICATION(S)

This application claims the benefit of U.S. Provisional Application No. 62/032,918 filed Aug. 4, 2014 for "LOW NOISE HYBRIDIZED DETECTOR USING CHARGE TRANSFER" by P. Dixon and N. Masaun.

STATEMENT OF GOVERNMENT INTEREST

This invention was made with government support under Contract No. N00014-12-C-0375 awarded by Office of Naval Research. The government has certain rights in the invention.

BACKGROUND

This invention generally relates to a device for detecting radiation in the near infrared (IR) spectrum. In particular, the invention relates to a low noise IR detector that operates by transferring charge rather than by charging and resetting a capacitor through which voltage is read.

Modern infrared (IR) imaging systems can be focal plane arrays of detectors and associated integrated circuitry in each pixel that transforms the collected signals into visual or other analyzable forms. Near IR detector systems that operate in the 1 to 1.7 µm wavelength region are sometimes combined with visible detection systems that operate in the 400 to 700 nm wavelength range to enhance detection and visualization in low light and early night scenarios. Combined visible and near IR imaging capability is increasingly becoming a strategic requirement for both commercial and military applications. Of the many materials used for imaging systems that operate in the near infrared (e.g. HgCdTe, Ge, InSb, PtSi, etc.), InGaAs p-i-n photodiodes have been chosen due to their high performance and reliability (G. Olsen, et al., "A 128×128 InGaAs detector array for 1.0-1.7 microns," in Proceedings SPIE, Vol. 1341, 1990, pp. 432-437).

Short wavelength infrared (SWIR) imaging arrays are normally hybrid devices where the photodiodes are interconnected to silicon transistor read out integrated circuitry (ROIC). In one effort to decrease cost and simplify complex manufacturing, an InGaAs/InP photodiode has been integrated with an InP junction field effect transistor (JFET) as a switching element for each pixel, as described by U.S. Pat. No. 6,005,266, Forrest et al. (which is incorporated herein by reference in its entirety). The combination of photodiode and FET on a single substrate enabled the formation of fully monolithic near IR focal plane arrays with reduced production cost and increased performance. The InP junction field effect transistors exhibited leakage currents as low as 2 pA. In related work, intentional doping of the absorption layer of a GaAs p-i-n photodiode was found to reduce the dark current as described by U.S. Pat. No. 6,573,581, Sugg. et al. (which is incorporated herein by reference in its entirety).

In previous detectors, light induced charge is collected in a single area that is then transferred to an external capacitor where the voltage on the capacitor is measured. The capacitor is then "reset" before the next measurement. Since it is difficult to completely reset a capacitor in a finite amount of time, and the collection area may be collecting charge during the reading operation itself, opportunities exist for variation in the amount of signal read.

SUMMARY

An infrared photodetector includes a small bandgap layer of first conductivity type; a large bandgap layer of first conductivity type overlaying the small bandgap layer; a collection well of second conductivity type in the large bandgap layer and in contact with the small bandgap layer so that the small bandgap layer and the collection well form an infrared photodiode; a standoff layer over a portion of the large bandgap layer; a transfer well of second conductivity type in the standoff layer and the large bandgap layer and spaced from the collection well and the small bandgap layer; and a transistor that includes the collection well, the transfer well and a region between the collection well and the transfer well.

In another embodiment, an infrared photodetector includes a small bandgap layer of a first conductivity type, a large bandgap layer of a first conductivity type on the small bandgap layer, and a second small bandgap layer on a portion of the second large bandgap layer. A transfer well of a second conductivity type is located in the second small bandgap layer and large bandgap layer. The transfer well is separated laterally from the collection well and vertically from the first small bandgap layer. Electrodes are positioned to cause charge transfer from the collection well to the transfer well.

In a further embodiment, a method of forming an infrared photodetector includes depositing a large bandgap layer of a first conductivity type on a small bandgap layer of a first conductivity type, and forming a standoff layer on a portion of the large bandgap layer. In a single diffusion step, a collection well of a second conductivity type is formed in large bandgap layer, and the first small bandgap layer, and a transfer well of a second conductivity type is formed in the standoff layer and the large bandgap layer. The transfer is spaced laterally from the collection well and vertically from the first small bandgap layer. Electrodes on the small bandgap layer are formed to allow charge transfer from the collection well to the transfer well.

DETAILED DESCRIPTION

Figure 1:
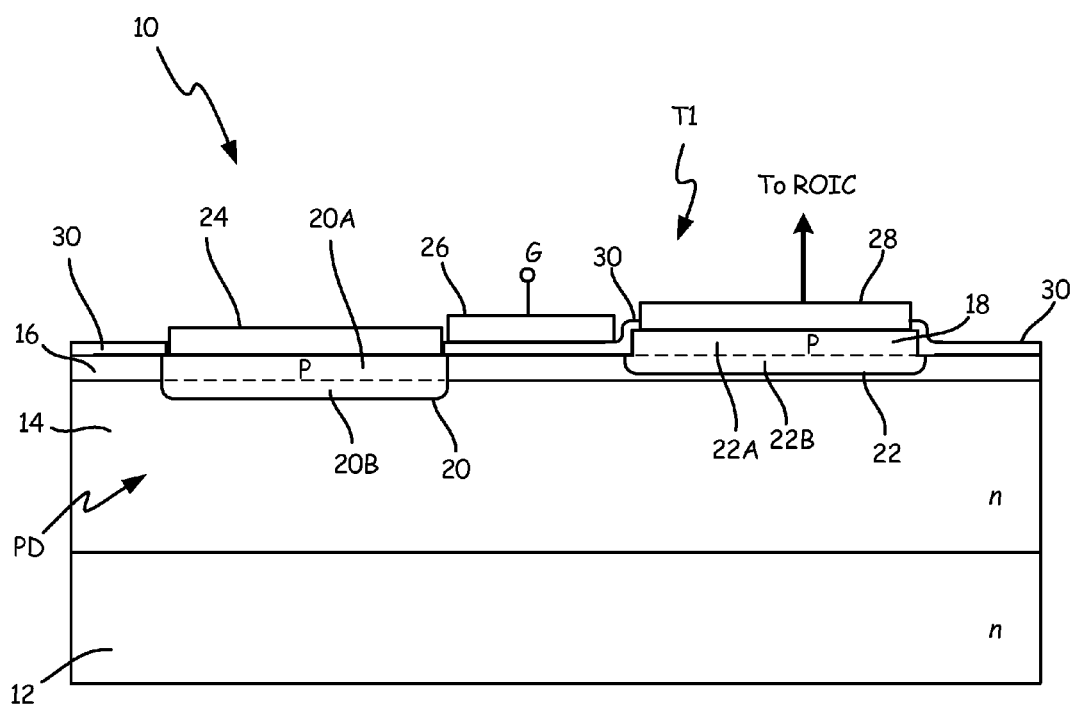
FIG. 1 is a schematic illustration of a photodetector/transistor device architecture of the invention.

FIG. 1 shows device 10, which includes integrated short wavelength infrared photodetector PD and low noise, epitaxial, multi-layer field effect transistor T1. This device architecture uses one area for charge collection and a separate area for charge measurement. In addition, a capacitor is not needed for measurement of signal level.

Although device 10 will be described based on InGaAs/InP material and device technology, the methods and features discussed herein are not intended to be limited to that material system alone, and other semiconductor materials, including other III-V and II-VI compound semiconductor materials, are included in the scope of the invention.

Device 10 is a multilayer structure including n type large bandgap base or substrate layer 12, n type small bandgap photosensor layer 14, n type large bandgap layer 16, small bandgap standoff layer 18, p type collection well 20, p type transfer well 22, source contact 24, gate transfer contact 26, and drain contact 28, and insulator layer 30. N type layer 14 and collection well 20 form short wavelength infrared (SWIR) photodiode PD. Layers 14, 16 and 18, collection well 20, transfer well 22, source electrode 24, gate transfer electrode 26 and drain electrode 28 form lateral junction field effect transistor (JFET) T1.

In one embodiment, n type large bandgap substrate layer 12 is InP with a bandgap of about 1.344 eV. N type small bandgap layer 14 is InGaAs with a thickness of about 3 to 3.5 μm and bandgap of about 0.74 eV. N type large bandgap layer 16 is InP with a thickness of about 0.5 to 1 μm and a bandgap of about 1.344 eV. Small bandgap standoff layer 18 is InGaAs with a thickness of about 0.5 μm or less and a bandgap of about 0.74 eV.

In this embodiment, P type collection well 20 is formed by diffusion into InP layer 16 and InGaAs layer 14. As a result, collection well 20 has a two layer structure comprising layers 20A and 20B. Layer 20A of collection well 20 is InP with a thickness of about 0.5 to 1.0 μm. Layer 20B of collection well 20 is InGaAs with a thickness of about 0.25 μm. Transfer well 22 is formed by diffusion into standoff layer 18 and large bandgap layer 16. As a result, transfer well 22 has a two-layer structure comprising layers 22A and 22B. Layer 22A of transfer well 22 is InGaAs with a thickness of about 0.5 μm or less. Layer 22B of transfer well 44 is InP with a thickness of about 0.05 μm.

Source electrode 24, gate transfer electrode 26, and drain electrode 28 may be Au, Cu, Ag, Pd, Pt, Ni and others known in the art.

Figure 2A:
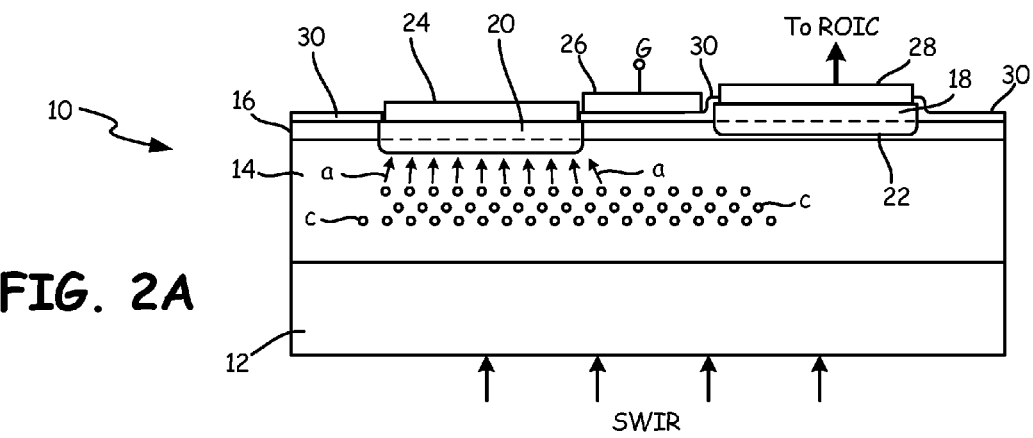
FIGS. 2A-2C are illustrations showing the operation of the photodetector of the invention.
Figure 2B:
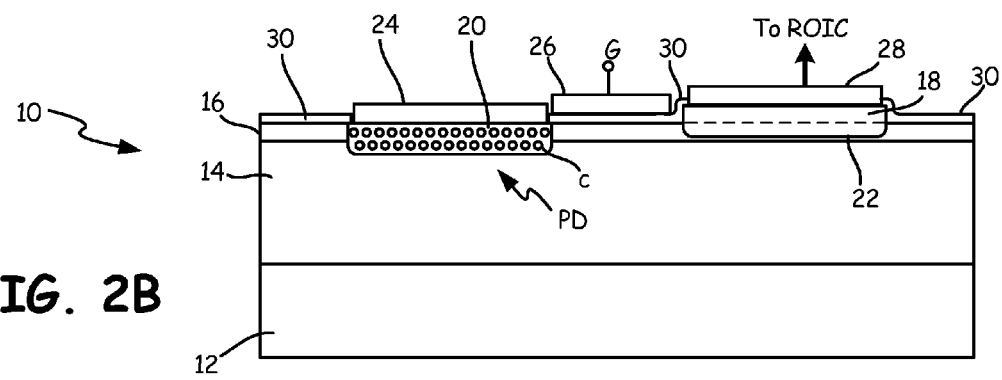
Figure 2C:
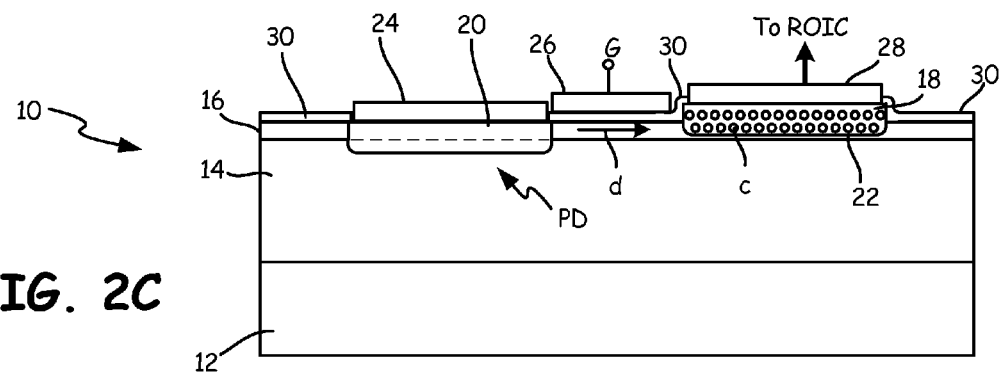

Schematic figures illustrating the operation of device 30 are shown in FIGS. 2A-2C. The device operates by collecting photoinduced carriers in P type collection well 20 of photodiode T1. The collected charge is transferred by transistor T1 from collection well 20 (which acts as the source region of T1) to transfer well 22 (which acts as the drain region of T1). The charge in transfer well 22 can then be read out without affecting generation and collection of carriers by photodiode PD.

In FIG. 2A, SWIR radiation is absorbed in high sensitivity photodetector layer 14 and produces photo-induced carriers c. In FIGS. 2A and 2B, the carriers are driven toward collection well 20 as indicated by arrows a, and are swept across the pn junction formed by n type photodetection layer 14 and collection well 20. As shown in FIGS. 2B and 2C the carriers, in collection well 20 are transferred to transfer well 22 as schematically shown by arrow d. A positive voltage on transfer gate electrode 26 inverts to p-type the underlying large bandgap layer 16 between collection well 20 and transfer well 22. This allows charges c in collection well 20 to move to transfer well 22. The charges in transfer well 22 may then be sampled by an external ROIC circuit. There is complete charge transfer and no reset noise is generated during the transfer.

Figure 3:
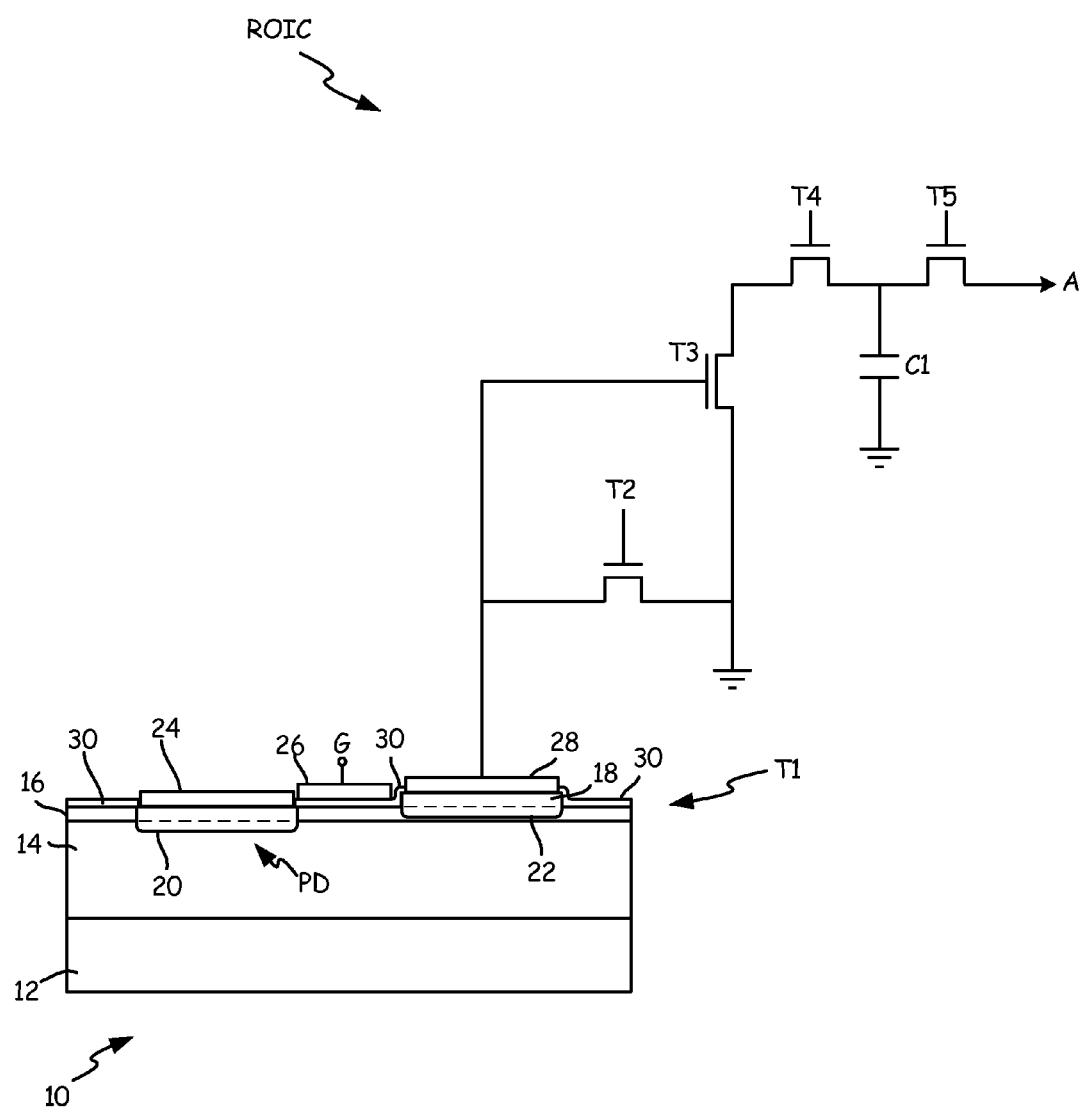
FIG. 3 is a schematic illustration of the photodetector and related read out integrated circuitry (ROIC) of the invention.

FIG. 3 shows device 10 with a portion of the ROIC circuitry. Transistor T1 of device 10 forms one transistor of a five transistor (5T) architecture used by the ROIC to acquire the photosignal generated by photodiode PD of device 10 for measurement. In a SWIR array, there will be an array of devices 30, together with associated 5T circuits. The photosignals are delivered by the 5T circuits to measurement and further signal processing circuitry (not shown).

The 5T circuit in FIG. 3 includes field effect transistors T1-T5 and optional capacitor C1. Transistor T2 is a reset transistor that is turned on to reset device 10 for the next charge transfer and readout cycle by connecting transfer well 22 to ground. This resets transfer well 22 before the next transfer of carriers from collection well 20.

Transistor T3 has its gate connected to drain contact 28 of device 10. Transistor T3 acts as a source follower, with its source voltage being a function of the charge in transfer well 22.

Transistors T4 and T5 are sample select and column select switches, respectively, that select the photosignal being delivered to the further ROIC circuitry. Capacitor C1 is used if it is desired to perform sample and column selects sequentially rather than simultaneously. In that case, voltage at the source of T3 is stored in capacitor C1 and then read out by turning on column select transistor T5.

A method of forming device 10 is shown in FIGS. 4A-4G, in which collection well 20 and transfer well 22 are formed with a single diffusion. Standoff layer 18 allows transfer well 22 to be shallower than collection well 20. As a result, p-type collection well 20 is in contact with n-type small bandgap layer 14 to form photodetector PD. P-type transfer well 22, on the other hand, is located only in standoff layer 18 and large bandgap layer 16. The pn junction formed by transfer well 22 and large bandgap layer 16 is not responsive to SWIR radiation.

Figure 4A:
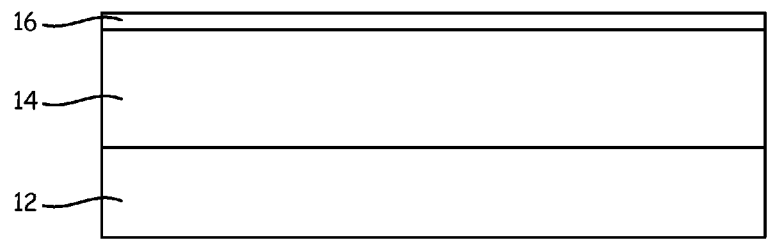
FIGS. 4A-4G are schematic illustrations of the formation steps of the invention.

The starting material shown in FIG. 4A is a multilayer heterostructure made up of layers 12, 14, and 16. As an example, layers 12 and 16 may be InP, and layer 14 may be InGaAs. The compositions and thicknesses of one specific embodiment have already been described. The heterostructure may be formed by any epitaxial growth process known in the art. Examples include organometallic vapor phase epitaxy (OMVPE), metal organic chemical vapor deposition (MOCVD), molecular beam epitaxy (MBE), and others known in the art. A preferred technique is MOCVD. In other embodiments, layer 14 may also be the substrate of the device, and layer 12 is not present.

Figure 4B:
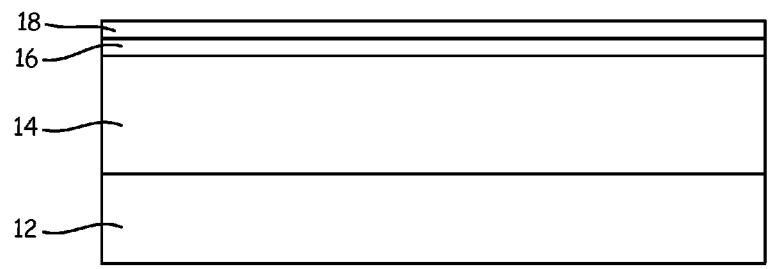
Figure 4C:
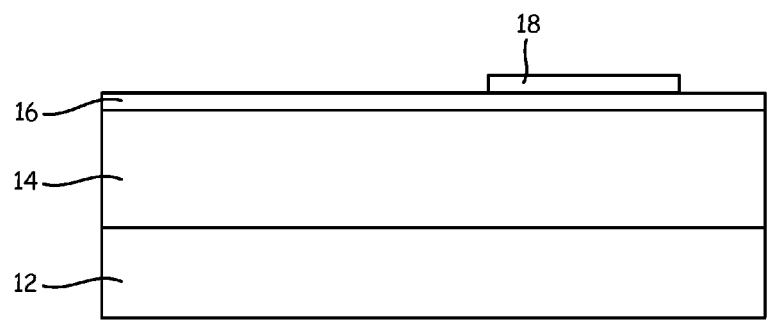

In the next step, as shown in FIG. 4B, standoff layer 18 is deposited on layer 16. In FIG. 4C, portions of standoff layer 18 have been removed. This can be achieved using photoresist masking and etching, or by other selective removal techniques.

Figure 4D:
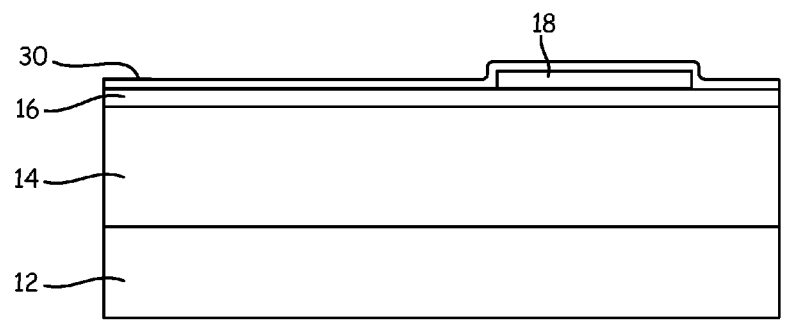

As shown in FIG. 4D insulator layer 30 has been deposited over the top surface of layer 16 and over standoff layer 18. Insulator layer 30 is, for example, silicon nitride or silicon oxynitride. Insulator layer 30 is an electrical insulator, and also functions as a diffusion barrier.

Figure 4E:
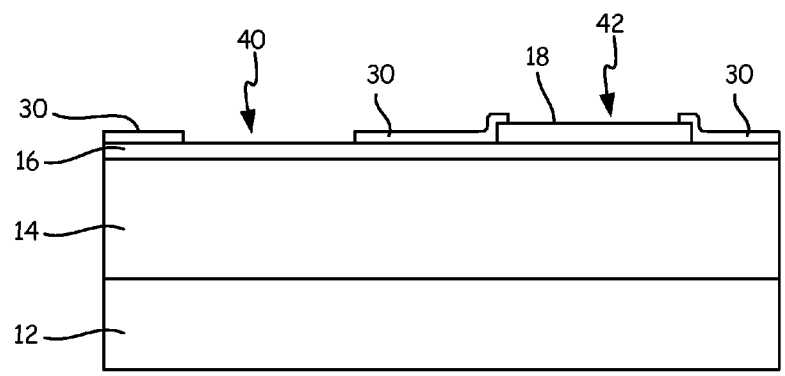

In FIG. 4E, diffusion windows 40 and 42 have been formed in insulator layer 30. Window 40 defines an opening through which a p-type dopant can be introduced for collection well 20. Window 42 defines an opening through which the p-type dopant can be introduced to form transfer well 22.

Figure 4F:
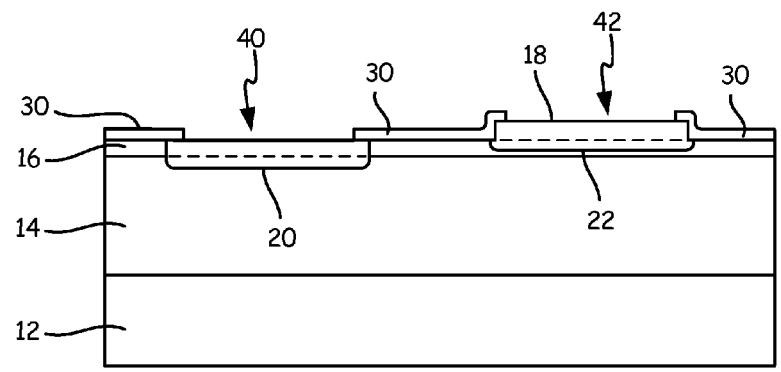

In FIG. 4F, a diffusion step has been performed to form collection well 20 and transfer well 22. In the case of collection well 20, the p-type dopant diffuses through large bandgap layer 16 into the upper portion of small bandgap layer 14. In the case of transfer well 22, the p-type dopant must first diffuse through standoff layer 18 before reaching large bandgap layer 16. The diffusion rate of the p-type dopant is lower in standoff layer 18 than in large bandgap layer 16. As a result, transfer well 22 is confined to standoff layer 18 and the upper portion of large bandgap 16. In this way, collection well 20 and transfer well 22 are formed with a single diffusion, yet have different depths.

Figure 4G:
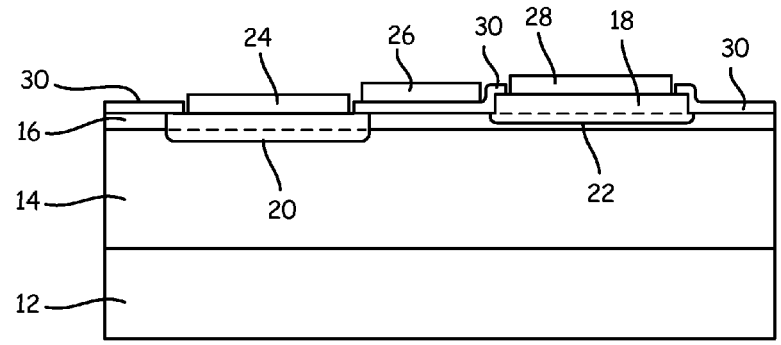

In the final step, as shown in FIG. 4G, contact regions are defined by photolithography and source contact 24, gate transfer contact 26, and drain contact 28 are deposited on collection well 20, insulator layer 30, and standoff layer 18, respectively. Contacts 24, 26, and 28 are deposited by photolithography, sputtering, electroplating or other means of deposition known in the art. Preferred contact materials are Au, Cu, Ag, Pd, Pt, Ni and others known in the art. In some embodiments, source contact 24 is not needed, and can be omitted. Standoff layer 18 is a small bandgap semiconductor, such as InGaAs, which helps to form an ohmic contact at drain contact 28.

Figure 5A:
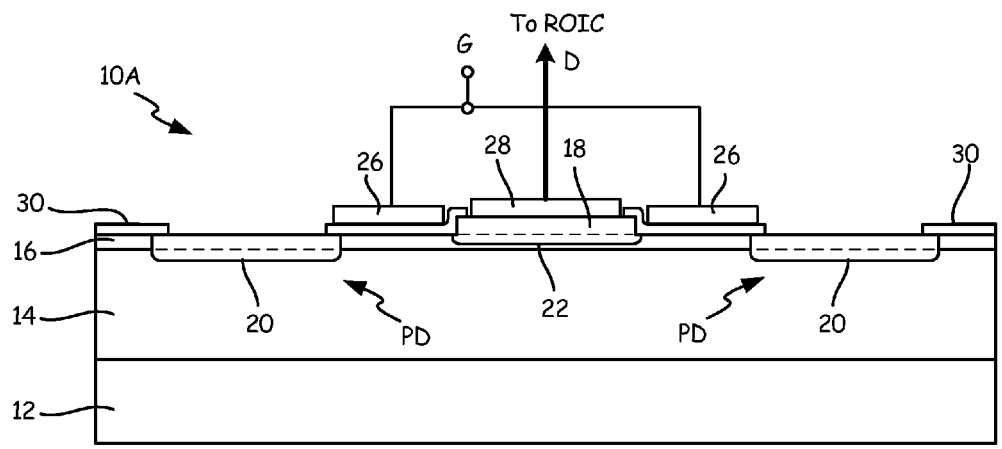
FIGS. 5A and 5B show alternate versions of the photodetector/transistor device.
Figure 5B:
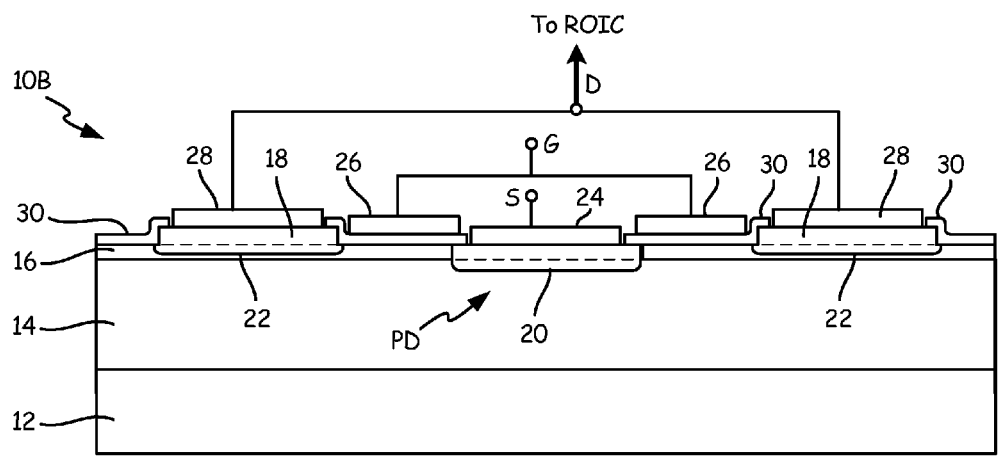

Alternate versions 10A and 10D of the photodetector/transistor device are illustrated in FIGS. 5A and 5B, respectively. In device 10A of FIG. 5, collection well 20 forms a ring around transfer well 22 and gate contact 26. Note that source contact is not present in device 10A.

In FIG. 5B, device 10B also uses a ring configuration. In this embodiment, transfer well 22 forms a ring around collection well 20 and gate contact 26.

The photodetector/transistor structures shown in FIGS. 1-2B, 5A and 5B offer certain design and manufacturing features and benefits. They include:

Charge well 42 may be a buried p type diffusion layer surrounded by a detailed bandgap engineered material on all sides except through the charge collection region. This allows charge to be collected while keeping collected dark current low and separating the collection area from the surface of the InGaAs material. This buried layer minimizes both surface recombination and shunt contribution to noise.

The integrated photodetector/transistor structure, plus a mechanism for dumping the charge from transfer well 22 may be included in 5-8 micrometer pixels.

By avoiding the capacitor reset noise of the prior art, the inherent noise of the pixel may be orders of magnitudes lower than prior art devices.

The architecture of the present invention may achieve up to about five times (5×) greater sensitivity enabling night imaging at below starlight levels while reducing pixel pitch by up to about three times (3×). As a result, the detectors may operate at lower light conditions; operate at higher operating temperature for a given light level; operate at lower power since, for example, cooling is not needed to improve performance; and higher resolution is achieved in a smaller detector with smaller optics and a higher areal density of chips on a wafer, resulting in reduced cost.

The integrated structure can be formed using only two different semiconductor materials (such as InP and InGaAs) and a single diffusion to achieve collection and transfer wells of different depths.

Discussion of Possible Embodiments

The following are nonexclusive descriptions of possible embodiments of the present invention.

An infrared photodetector includes a small bandgap layer of first conductivity type; a large bandgap layer of first conductivity type overlaying the small bandgap layer; a standoff layer on a portion of the large bandgap layer; a collection well of second conductivity type in the large bandgap layer and in contact with the small bandgap layer so that the small bandgap layer and the collection well form an infrared photodiode; a transfer well of second conductivity type in the standoff layer and the large bandgap layer and spaced from the collection well and the small bandgap layer; and a transistor that includes the collection well, the transfer well and a region between the collection well and the transfer well.

An infrared photodetector may include a first small bandgap layer of a first conductivity type; a large bandgap layer of a first conductivity type may be on the first bandgap layer; a second small bandgap layer on a portion of the large bandgap layer; a collection well of a second conductivity type may be located in the first small bandgap layer and large bandgap layer; a transfer well of a second conductivity type may be located in the second small bandgap layer and the first large bandgap layer, the transfer well being spaced laterally from the collection well and vertically from the first small bandgap layer; and electrodes on the second small band gap layer may be positioned to cause transfer of charge from the collection well to the transfer well.

A drain electrode coupled to the transfer well; and a gate electrode is coupled to the region between the collection well and the transfer well.

The gate and drain electrodes comprise Ti, Pt, Au, Ni, Cu, or combinations thereof.

An insulator layer is located between the gate electrode and the large bandgap layer.

The transfer well extends to a top surface of the standoff layer.

The transfer well extends to a top surface of the second small bandgap layer.

The collection well extends to a top surface of the large bandgap layer.

The standoff layer comprises a small bandgap semiconductor.

The small bandgap layer and the standoff layer comprise InGaAs, and the large bandgap layer comprises InP.

The collection well extends to a top surface of the large bandgap layer.

The transfer well extends to a top surface of the second small bandgap layer.

A method of forming an infrared photodetector may include: depositing a small bandgap layer of first conductivity type; depositing a large bandgap layer of first conductivity type on the first small bandgap layer of first conductivity type; forming a standoff layer on a portion of the large bandgap layer; and forming by a single diffusion a collection well of second conductivity type located in the large bandgap layer and the small bandgap layer, and a transfer well of second conductivity type located in the standoff layer and the large bandgap layer and spaced from the collection well and the small bandgap layer.

The method of the preceding paragraph can optionally include, additionally and/or alternatively any, one or more of the following features, configurations, and/or additional components:

The method comprises forming electrodes overlying the collection well, the transfer well, and a region between the collection well and the transfer well.

The standoff layer comprises depositing a second small bandgap layer on the large bandgap layer; and selectively removing a portion of the second small bandgap layer to define the standoff layer.

Forming by a single diffusion step comprises depositing an insulator layer over the large bandgap layer and the standoff layer; forming an opening in the insulator layer over a portion of the large bandgap layer to define a location of the collection well; forming an opening in the insulator layer over the standoff layer to define a location of the transfer well; and diffusing a dopant through the openings in the insulator layer to form the collection well and the transfer well.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An infrared photodetector comprising:
a small bandgap layer of first conductivity type;
a large bandgap layer of first conductivity type overlying the small bandgap layer;
a standoff layer on a portion of the large bandgap layer;
a collection well of second conductivity type in the large bandgap layer and in contact with the small bandgap layer so that the small bandgap layer and the collection well form an infrared photodiode;
a transfer well of second conductivity type in the standoff layer and the large bandgap layer and spaced from the collection well and the small bandgap layer; and
a transistor that includes the collection well, the transfer well and a region between the collection well and the transfer well.

2. The infrared photodetector of claim 1, wherein the transistor further includes:
a drain electrode coupled to the transfer well; and
a gate electrode coupled to the region between the collection well and the transfer well.

3. The infrared photodetector of claim 2, wherein the gate and drain electrodes comprise Ti, Pt, Au, Ni, Cu, or combinations thereof.

4. The infrared photodetector of claim 2, and further comprising:
an insulator layer between the gate electrode and the large bandgap layer.

5. The infrared photodetector of claim 1 wherein the transfer well extends to a top surface of the standoff layer.

6. The infrared photodetector of claim 1 wherein the collection well extends to a top surface of the large bandgap layer.

7. The infrared photodetector of claim 1, wherein the standoff layer comprises a small bandgap semiconductor.

8. The infrared photodetector of claim 1, wherein the small bandgap layer and the standoff layer comprise InGaAs, and the large bandgap layer comprises InP.

9. An infrared photodetector comprising:
a first small bandgap layer of first conductivity type;
a large bandgap layer of first conductivity type on the first small bandgap layer of first conductivity type;
a second small bandgap layer on a portion of the large bandgap layer;
a collection well of second conductivity type located in the first small bandgap layer and the large bandgap layer;
a transfer well of second conductivity type located in the second small bandgap layer and the first large bandgap layer, the transfer well being spaced laterally from the collection well and vertically from the first small bandgap layer; and
electrodes positioned to cause transfer of charge from the collection well to the transfer well.

10. The infrared photodetector of claim 9, wherein the collection well extends to a top surface of the large bandgap layer.

11. The infrared photodetector of claim 9, wherein the transfer well extends to a top surface of the second small bandgap layer.

* * * * *